(12) United States Patent
Duncan et al.

(10) Patent No.: US 10,128,798 B2
(45) Date of Patent: Nov. 13, 2018

(54) ADJUSTING ENVELOPE TRACKING POWER SUPPLY

(71) Applicant: QUALCOMM Incorporated, San Diego, CA (US)

(72) Inventors: Joseph Duncan, Carlsbad, CA (US); Thomas Marra, San Diego, CA (US); Song Shi, San Diego, CA (US); Iulian Mirea, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/643,242

(22) Filed: Jul. 6, 2017

(65) Prior Publication Data
US 2018/0034416 A1 Feb. 1, 2018

Related U.S. Application Data

(60) Provisional application No. 62/368,678, filed on Jul. 29, 2016.

(51) Int. Cl.
| | | |
|---|---|---|
| *H01Q 11/12* | (2006.01) | |
| *H03F 1/02* | (2006.01) | |
| *H03F 1/26* | (2006.01) | |
| *H03F 3/195* | (2006.01) | |
| *H03F 3/213* | (2006.01) | |
| *H04B 1/04* | (2006.01) | |

(52) U.S. Cl.
CPC ......... *H03F 1/0216* (2013.01); *H03F 1/0211* (2013.01); *H03F 1/26* (2013.01); *H03F 3/195* (2013.01); *H03F 3/213* (2013.01); *H03F 2200/102* (2013.01); *H03F 2200/451* (2013.01); *H03F 2200/504* (2013.01); *H04B 2001/0408* (2013.01)

(58) Field of Classification Search
CPC ...... H03F 1/216; H03F 1/26; H03F 2200/102; H03F 2200/451
USPC .......................... 455/127.1, 117, 343.1, 572
See application file for complete search history.

(56) References Cited

U.S. PATENT DOCUMENTS

| | | | | |
|---|---|---|---|---|
| 7,812,583 | B2 * | 10/2010 | Xi ........................... | H02M 1/44 |
| | | | | 323/282 |
| 9,397,712 | B2 | 7/2016 | Jiang et al. | |
| 9,819,313 | B2 * | 11/2017 | Deo ...................... | H03F 1/0233 |
| 9,853,600 | B1 * | 12/2017 | Jha ........................ | H03F 1/0216 |
| 2008/0157895 | A1 | 7/2008 | Immonen et al. | |
| 2014/0028368 | A1 * | 1/2014 | Khlat ................. | H03H 21/0021 |
| | | | | 327/311 |
| 2014/0155116 | A1 | 6/2014 | Dakshinamurthy et al. | |

(Continued)

OTHER PUBLICATIONS

International Search Report and Written Opinion—PCT/US2017/041190—ISA/EPO—dated Sep. 6, 2017.

*Primary Examiner* — Sonny Trinh
(74) *Attorney, Agent, or Firm* — Patterson & Sheridan, L.L.P. Qualcomm

(57) ABSTRACT

Certain aspects of the present disclosure provide methods and apparatus for operating an envelope tracking power supply. The method may include receiving, from a modem of a device, information indicative of a transmit waveform statistic of a signal to be wirelessly transmitted by the device. The method may further include adjusting a configuration of the envelope tracking power supply based on the transmit waveform statistic of the signal.

16 Claims, 6 Drawing Sheets

(56) References Cited

U.S. PATENT DOCUMENTS

| | | |
|---|---|---|
| 2014/0155127 A1* | 6/2014 | Dakshinamurthy ........................ H04W 52/028 455/574 |
| 2015/0080063 A1* | 3/2015 | Sorrells ............ H04W 52/0209 455/574 |
| 2015/0098523 A1 | 4/2015 | Lim et al. |
| 2016/0072457 A1 | 3/2016 | Subrahmaniyan et al. |
| 2016/0126901 A1 | 5/2016 | Knopik |
| 2016/0165543 A1 | 6/2016 | Drogi |
| 2016/0294284 A1 | 10/2016 | Lerdworatawee et al. |
| 2016/0373142 A1* | 12/2016 | Chen ........................ H04B 1/04 |

* cited by examiner

ADJUSTING ENVELOPE TRACKING POWER SUPPLY

CROSS-REFERENCE TO RELATED APPLICATIONS

This application claims the benefit of U.S. Provisional Patent No. 62/368,678, filed Jul. 29, 2016. The content of the provisional application is hereby incorporated by reference in its entirety.

TECHNICAL FIELD

Certain aspects of the present disclosure generally relate to electronic circuits and, more particularly, to envelope tracking power supplies for amplification systems.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, or later system, which may provide network service via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

Amplifiers (e.g., transimpedance amplifiers, inverting amplifiers, etc.) may be used in a variety of systems (which may be referred to as amplification systems) to increase the power of an input signal, including for wireless communication systems. For example, amplifiers may be used in radio frequency (RF) systems, to increase the power of a signal for transmission, or increase the power of a received signal.

Such RF systems may implement envelope tracking, in which the power supply voltage to the amplifier is adjusted so as to roughly track the envelope of a signal for transmission.

SUMMARY

Certain aspects of the present disclosure provide a method for operating an envelope tracking power supply. The method includes receiving, from a modem of a device, information indicative of a transmit waveform statistic of a signal to be transmitted by the device. The method further includes adjusting a configuration of the envelope tracking power supply based on the transmit waveform statistic of the signal.

Certain aspects of the present disclosure provide a method for operating an envelope tracking power supply. The method includes receiving, from a modem of a device, information indicative of at least one of a frequency, a bandwidth, or a resource block allocation for receiving a signal. The method further includes adjusting a configuration of the envelope tracking power supply based on the at least one of the frequency, the bandwidth, or the resource block allocation for receiving the signal.

Certain aspects of the present disclosure provide an envelope tracking power supply. The envelope tracking power supply includes a voltage regulator and a controller. The controller is configured to receive, from a modem of a device, information indicative of a transmit waveform statistic of a signal to be transmitted by the device. The controller is further configured to adjust a configuration of the envelope tracking power supply based on the transmit waveform statistic of the signal.

Certain aspects of the present disclosure provide an envelope tracking power supply. The envelope tracking power supply includes a voltage regulator and a controller. The controller is configured to receive from a modem of a device, information indicative of at least one of a frequency, a bandwidth, or a resource block allocation for receiving a signal. The controller is further configured to adjust a configuration of the envelope tracking power supply based on the at least one of the frequency, the bandwidth, or the resource block allocation for receiving the signal.

Certain aspects of the present disclosure provide an envelope tracking power supply. The envelope tracking power supply includes means for receiving, from a modem of a device, information indicative of a transmit waveform statistic of a signal to be transmitted by the device. The envelope tracking power supply further includes means for adjusting a configuration of the envelope tracking power supply based on the transmit waveform statistic of the signal.

Certain aspects of the present disclosure provide an envelope tracking power supply. The envelope tracking power supply includes means for receiving, from a modem of a device, information indicative of at least one of a frequency, a bandwidth, or a resource block allocation for receiving a signal. The envelope tracking power supply further includes means for adjusting a configuration of the envelope tracking power supply based on the at least one of the frequency, the bandwidth, or the resource block allocation for receiving the signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
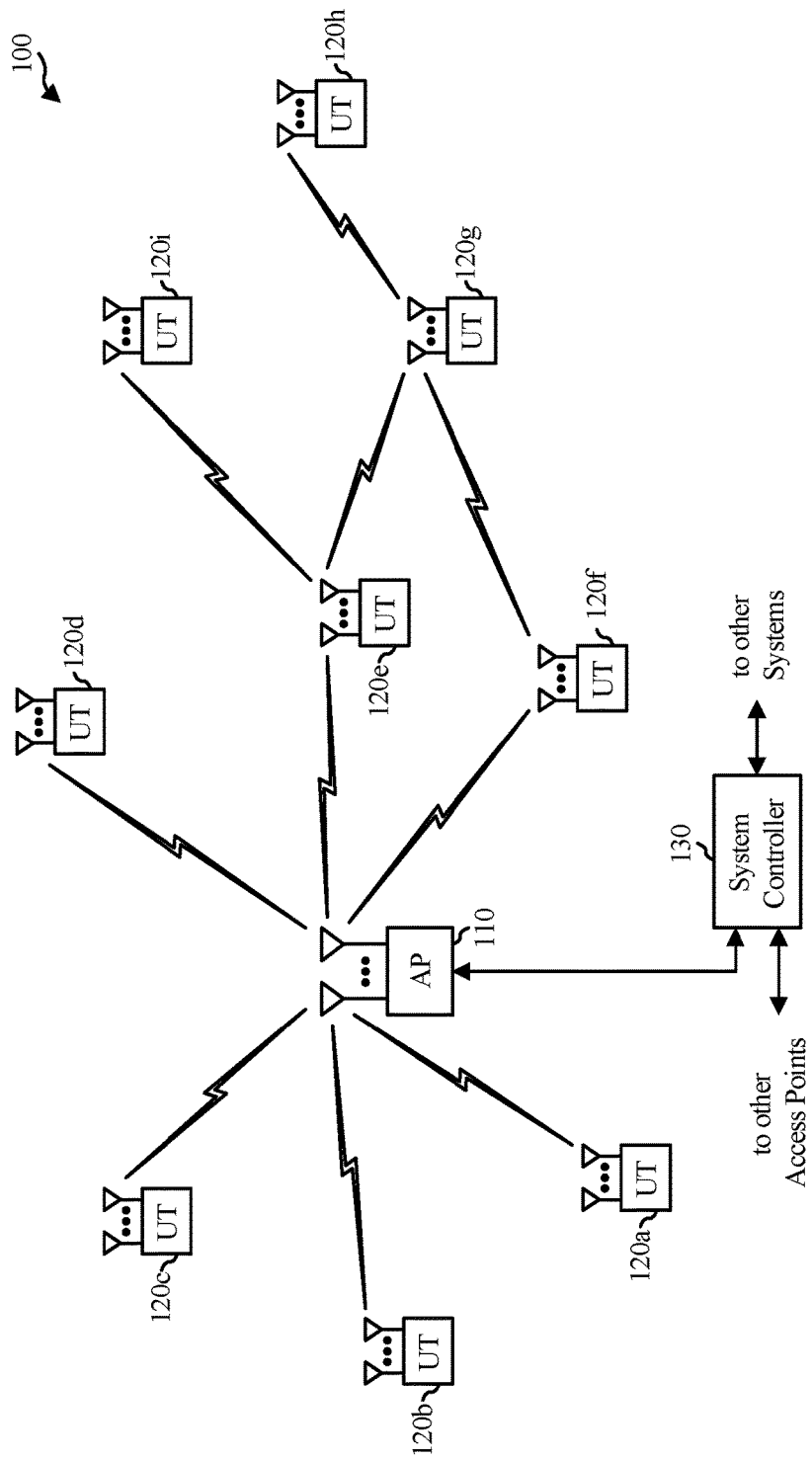
FIG. 1 is a diagram of an example wireless communications network, in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more amplifiers to amplify signals for transmission. At least one of the amplifiers may be coupled to an envelope tracking power supply designed in accordance with certain aspects of the present disclosure.

Figure 2:
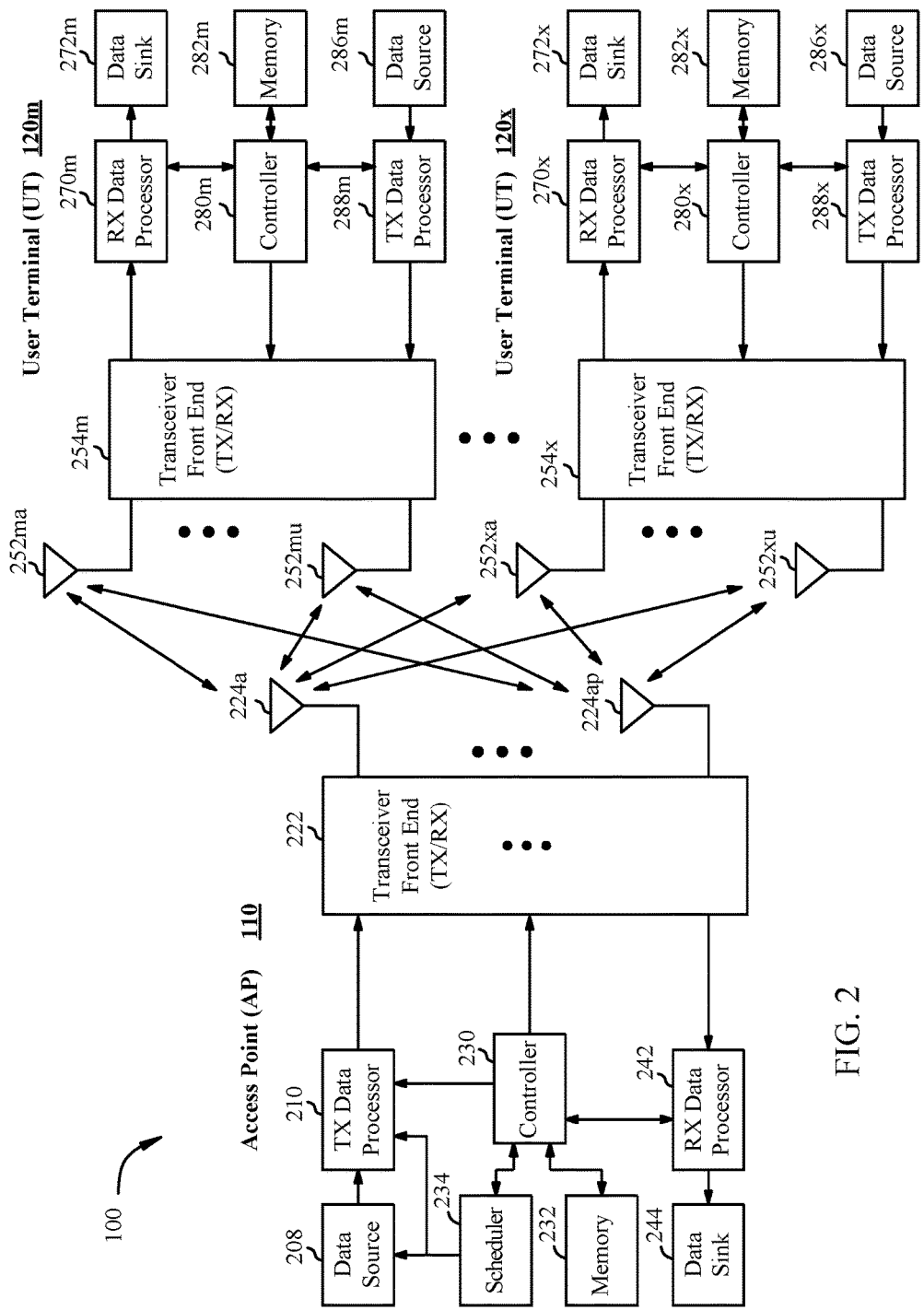
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. In some embodiments, the access point 110 is instead implemented as a base station and/or one or more of the user terminals 120 are instead implemented as a mobile station. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals may be selected for simultaneous transmission on the uplink, $N_{dn}$ user terminals may be selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point, base station, mobile station, and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver/front end (TX/RX) 254 (also known as a radio frequency front end (RFFE)) receives and processes (e.g., converts to analog, amplifies, filters, and frequency upconverts) a respective symbol stream to generate an uplink signal. The transceiver/front end 254 may also route the uplink signal to one of the $N_{ut,m}$ antennas for transmit diversity via an RF switch, for example. The controller 280 may control the routing within the transceiver/front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver/front end 222 may select signals received from one of the antennas 224 for processing. The signals received from multiple antennas 224 may be combined for enhanced receive diversity. The access point's transceiver/front end 222 also performs processing complementary to that performed by the user terminal's transceiver/front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver/front end (TX/RX) 222 of access point 110 and/or transceiver/front end 254 of user terminal 120 may include one or more amplifiers to amplify signals for transmission. At least one of the amplifiers may be coupled to an envelope tracking power supply designed in accordance with certain aspects of the present disclosure. While FIG. 2 illustrates the transceiver/front end 254 in a single box, those of skill in the art will appreciate that elements of the transceiver/front end 254 may be implemented across various elements, chips, modules, etc. For example, down and/or upconversion elements may be included in a transceiver chip within the transceiver/front end 254, while a power amplifier and/or envelope tracking elements may be implemented in a module separate from the transceiver chip within the transceiver/front end 254.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one of the $N_{ap}$ antennas. The transceiver/front end 222 receives and processes (e.g., converts to analog, amplifies, filters, and frequency upconverts) the symbol stream to generate a downlink signal. The transceiver/front end 222 may also route the downlink signal to one or more of the $N_{ap}$ antennas 224 for transmit diversity via an RF switch, for example. The controller 230 may control the routing within the transceiver/front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver/front end 254 may select signals received from one of the antennas 252 for processing. The signals received from multiple antennas 252 may be combined for enhanced receive diversity. The user terminal's transceiver/front end 254 also performs processing complementary to that performed by the access point's transceiver/front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof, among other systems/schemes.

Figure 3:
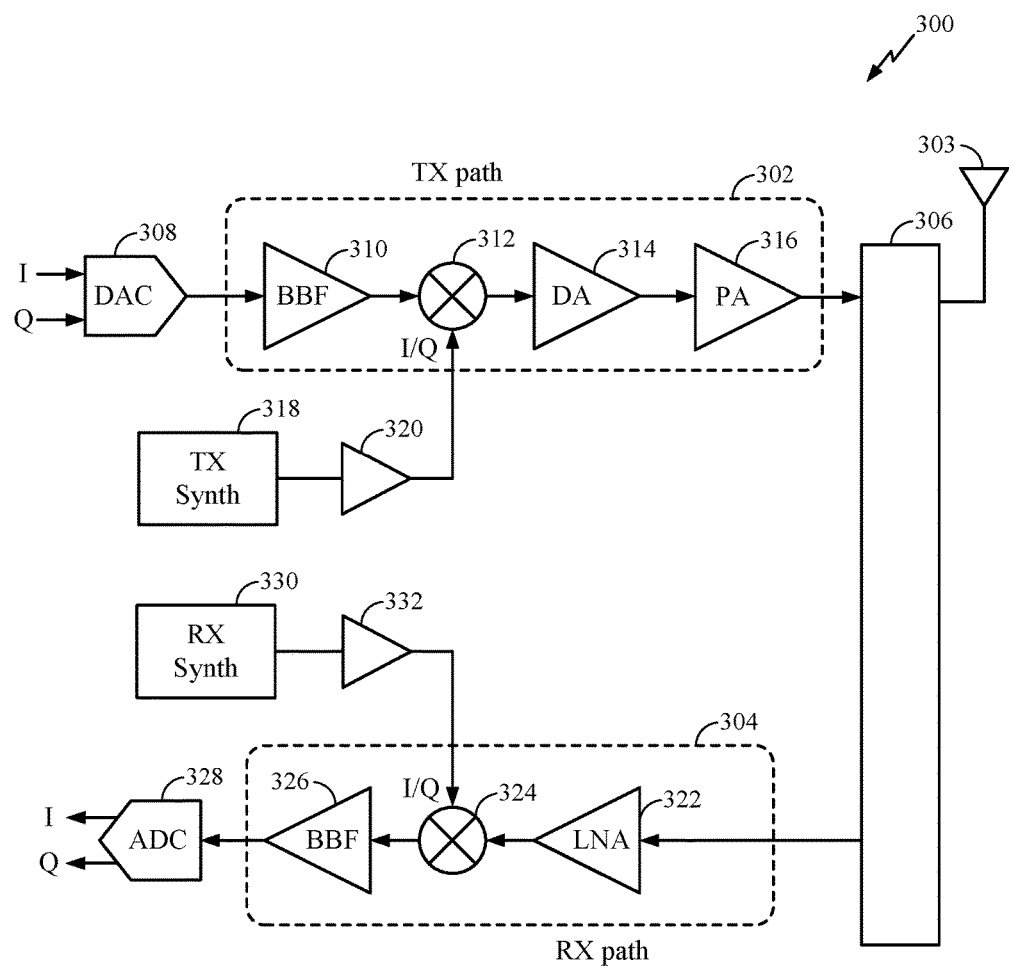
FIG. 3 is a block diagram of an example transceiver/front end, in accordance with certain aspects of the present disclosure.

FIG. 3 is a block diagram of an example transceiver/front end 300, such as transceiver/front ends 222, 254 in FIG. 2, in accordance with certain aspects of the present disclosure. The transceiver/front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which may involve compromises between stability and tunability. Contemporary systems may employ frequency synthesizers with a VCO to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324. The transceiver/front end 300 may, for example, be configured for quadrature or polar operation.

In some aspects, the power supply to the PA 316 may comprise an envelope tracking power supply, in accordance with certain aspects described herein. The envelope tracking supply may be configured to adjust the power supply of the PA 316 such that the power supplied to the PA 316 is based on or substantially tracks the envelope (e.g., envelope waveform) of the signal to be amplified by the PA 316, for example as described in more detail with respect to FIG. 4.

Figure 4:
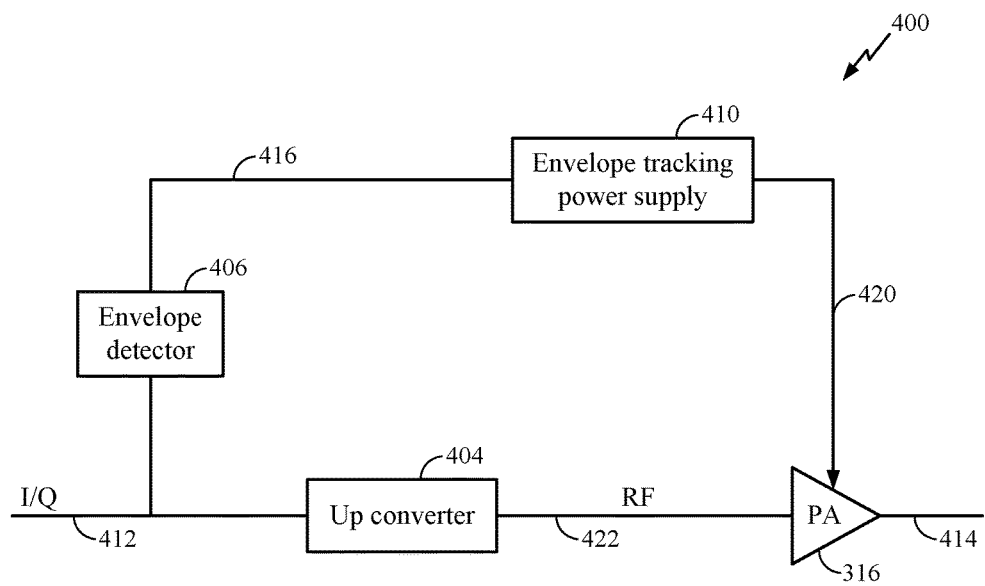
FIG. 4 illustrates an example envelope tracking amplification system, in accordance with certain aspects of the present disclosure.

FIG. 4 illustrates an example envelope tracking amplification system 400. The envelope tracking amplification system 400 may include the power amplifier 316, an up-converter 404, an envelope detector 406, and an envelope tracking power supply 410. As illustrated, the amplifier 316 may be configured to amplify an input signal 412. The input signal 412 may represent an in-phase (I) or quadrature-phase (Q) signal (e.g., from the transceiver/front end 300). In some cases, the input signal may form an input to the up-converter 404, which generates an RF input signal 422 for the amplifier 316.

The input signal 412 also forms an input to the envelope detector 406, which generates an envelope signal representing the envelope of the input signal 412 at its output 416 (e.g., provides a signal representing the magnitude of the input signal 412). The output 416 of the envelope detector 406 provides an input to the envelope tracking power supply 410, which in dependence thereon provides a supply voltage 420 to the amplifier 316. Though not shown, in some aspects there may be additional post-processing or pre-distortion applied to the output 416 before being input to the envelope tracking power supply 410. Therefore, the supply voltage 420 of the amplifier is adjusted based on (e.g., tracks) the envelope of the input signal 412. The amplifier 316 generates an amplified output signal 414 based on the input signal 412 (and RF input signal 422). The amplifier 316 may be implemented as a single stage or multi-stage amplifier.

Figure 4A:
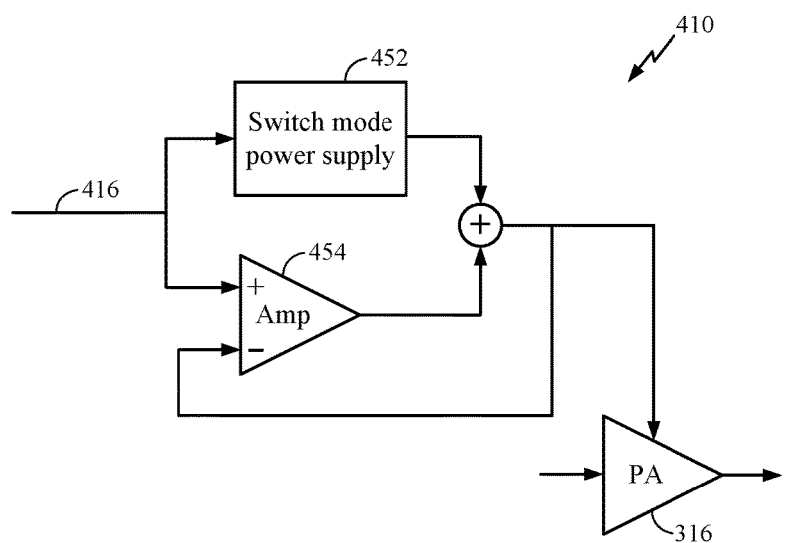
FIG. 4A illustrates an example envelope tracking power supply, in accordance with certain aspects of the present disclosure.

FIG. 4A illustrates an example envelope tracking power supply 410. As shown, the envelope tracking power supply 410 includes a switch mode power supply 452 and an amplifier (e.g., linear amplifier) 454. Each of the switch mode power supply 452 and the amplifier 454 may receive the envelope signal provided on the output 416 and provide power (e.g., current) at a voltage (e.g., at the voltage of supply voltage 420) that is based on the envelope signal. The power of each of the switch mode power supply 452 and the amplifier 454 may be summed to generate the supply voltage 420 to the amplifier 316. In this way, the switch mode power supply 452 and/or the amplifier 454 may be configured to regulate the voltage supplied to the amplifier 316. In some aspects, though not shown, the switch mode power supply 452 may be controlled by a linear amplifier.

In some aspects, the envelope detector 406 may be included in a modem (also referred to as a "baseband processor"). In some aspects, the modem may include one or more of a RX Data Processor 270, a TX Data Processor 288, a DAC 308, and an ADC 328. In some aspects, the modem may include one or more of a RX Data Processor 242, a TX Data Processor 210, a DAC 308, and an ADC 328. In some aspects, the modem may be implemented as a single chip (e.g., integrated circuit). Accordingly, in some aspects, the envelope detector 406 may be implemented in the single chip comprising the modem.

In some aspects, the envelope tracking power supply 410 may be implemented as a single chip (e.g., integrated circuit, such as, an envelope tracking integrated circuit (ETIC)). In some aspects, the envelope detector 406 may be implemented in the same chip as the envelope tracking power supply 410. For example, the envelope tracking power supply may be implemented in a power management IC (PMIC), in a separate chip or module for envelope tracking, or packaged together with the PA 316.

An Example Envelope Tracking Power Supply

Certain aspects of the present disclosure generally relate to envelope tracking power supplies. In particular, certain aspects of the present disclosure relate to techniques for operating envelope tracking power supplies to optimize performance of the envelope tracking power supplies. The envelope tracking power supplies may be included in communication devices such as access points or base stations 110 and/or user terminals or mobile stations 120 to provide a supply voltage for amplifiers for wirelessly transmitting signals.

In certain aspects, the techniques herein relate to changing a configuration of an envelope tracking power supply (e.g., envelope tracking power supply 410) that provides a voltage supply to an amplifier (e.g., PA 316) based on certain operating statistics of a device (e.g., access point 110, user terminal 120, etc.) that includes the envelope tracking power supply. In certain aspects, the configuration is changed dynamically (e.g., during operation) of the device, based on the operating statistics of the device. In some aspects, the configuration is changed based on one or more waveform statistics (e.g., the carrier frequency, bandwidth, resource block (RB) allocation, modulation scheme, peak-to-average power ratio (PAPR), etc.) of a signal to be amplified by the amplifier and transmitted by the device, also referred to as transmit waveform statistics. In some aspects, the configuration is changed based on a signal strength (e.g., signal-tonoise ratio, power level, received signal strength indicator (RSSI), received channel power indicator (RCPI), etc.) of a signal received by the device including the envelope tracking power supply. In some aspects, the configuration is changed based on a frequency, bandwidth, and/or RB allocation for receiving signals at the device that includes the envelope tracking power supply. Accordingly, different transmit waveform statistics, signal strength of a received signal, and frequency, bandwidth, and/or RB allocation for receiving signals are all different operating statistics of a device that includes the envelope tracking power supply.

In certain aspects, changing a configuration of the envelope tracking power supply refers to changing one or more parameters of the envelope tracking power supply, such as, a switching frequency of a switching regulator (e.g., switch mode power supply 452) of the envelope tracker, a bias current of an amplifier (e.g., amplifier 454) of the envelope tracker, a bandwidth of the amplifier, a compensation of the amplifier, an internal voltage headroom of the envelope tracking power supply, etc. In certain aspects, changing a configuration of the envelope tracking power supply refers to adjusting a filter (e.g., notch filter at the output of the envelope tracking power supply) to reduce noise in the envelope tracking power supply. In certain aspects, adjusting a filter refers to adjusting an actual filter (e.g., notch filter) included in the envelope tracking power supply, ETIC, or external from the ETIC. In certain aspects, adjusting a filter refers to adjusting the sampling of switching edges of a switching regulator included in the envelope tracking power supply.

In certain aspects, the specific parameter(s) of the one or more parameters of the envelope tracking power supply changed is based on which operating statistic is used to determine the change. In other words, in certain aspects, there is a specific relationship between which parameters of the envelope tracking power supply are changed and which operating statistic the change in parameters is based on. For example, where the operating statistic is the bandwidth of a signal to be amplified and transmitted, one of the parameters to be changed may be the switching frequency of a switching regulator of the envelope tracker.

Further, in certain aspects, how the specific parameter(s) of the one or more parameters of the envelope tracking power supply are changed is based on which operating statistic is used to determine the change. In other words, in certain aspects, there is a specific relationship between how parameters of the envelope tracking power supply are changed and which operating statistic the change in parameters is based on. For example, in certain aspects, when the bandwidth of a signal to be amplified and transmitted is higher, the switching frequency of a switching regulator of the envelope tracker is set higher, and when the bandwidth is lower, the switching frequency is set lower.

Some other specific examples include adjusting a parameter including the center frequency of a notch filter of the envelope tracking power supply based on the operating statistic of the frequency separation between duplex frequencies (e.g., the separation between the frequency used to transmit signals and the frequency used to receive signal at the device including the envelope tracking power supply). In particular, the center frequency of the notch filter may be set to reduce or minimize noise at the duplex frequencies. In another example, the amplifier bias current of the envelope tracking power supply may be adjusted based on the separation between duplex frequencies. For example, the lesser the separation between the duplex frequencies, the higher the amplifier bias current. In certain aspects, other noise shaping techniques may be implemented to minimize noise at the duplex spacing frequency.

Envelope tracking power supplies may be used to support a wide bandwidth of signals and large peak-to-average ratios for the signals to be amplified. For example, RF signals generated for devices communicating in networks such as 3G or LTE networks may have bandwidths that vary by as much as 200 times. The optimal configuration of an envelope tracking power supply may vary with respect to the actual transmit waveform statistics of the RF signal to be amplified. For example, the power conversion efficiency and receive-band noise (RxBN) (e.g., out of band noise generated by a transmitter of a device at a receiver of the device) of the envelope tracking power supply may be based on the actual transmit waveform statistics of the RF signal to be amplified and the configuration of the envelope tracking power supply. Accordingly, in some aspects, the configuration may be changed based on the actual transmit waveform statistics of the RF signal to be amplified to improve power conversion efficiency and reduce RxBN.

For example, in some aspects, the envelope tracking power supply may be configured based only on an overall set of transmit waveform statistics (e.g., system frequency and bandwidth) utilized by multiple devices or signals, but not based on the particular transmit waveform statistics (e.g., frequency and/or bandwidth) at which a signal is allocated or actually transmitted by a given device. For example, the envelope tracking power supply may be configured based only on a band (e.g., LTE band) and channel bandwidth. For example, in FDD LTE, a band may define an uplink frequency range for signals carried on the uplink, a downlink frequency range for signals carried on the downlink, a bandwidth for the uplink frequency range and the downlink frequency range, a duplex spacing between the center frequency of the downlink and the center frequency of the uplink, and a band gap between the downlink frequency range and the uplink frequency range. For TDD LTE, a band may define a frequency range for the uplink and downlink and a bandwidth for the frequency range.

Such a band may be used for all communications in a communications network. In particular, there may be multiple signals for multiple devices allocated over the band. Any particular signal transmitted by a device, however, may actually use a different set of transmit waveform statistics, such as being carried by or allocated to only a subset of the overall system frequency and/or bandwidth. For example, a band may be divided into one or more channels that correspond to subsets of the frequency and/or bandwidths of the band. Further, each channel may be subdivided into resource block (RBs), which may be different subcarriers of each channel. Accordingly, in certain aspects, within the band any given signal may actually be transmitted at different frequencies and/or bandwidths (e.g., allocated on different channels, RBs, etc.) of the band. Configuring the envelope tracking power supply based only on the band and corresponding channel bandwidth, therefore, may require the envelope tracking power supply have a single configuration across a large range of frequencies, and therefore operation may not be optimized across the entire frequency range in certain embodiments.

Accordingly, some aspects herein provide for configuring an envelope tracking power supply (e.g., envelope tracking power supply 410) based on the actual transmit waveform statistics of a given signal, to be transmitted by a device, that is to be amplified, such as based on an allocation for the signal of a subset (e.g., one or more RBs) of an overall system frequency and bandwidth. In some aspects, one or more parameters of the envelope tracking power supply, such as a switching frequency of a switching regulator (e.g., switch mode power supply 452) of the envelope tracker, a bias current of an amplifier (e.g., amplifier 454) of the envelope tracker, a bandwidth of the amplifier, a compensation of the amplifier, an internal voltage headroom of the envelope tracking power supply, etc. may be changed based on the allocated subset of the system frequency and bandwidth or actual frequency and bandwidth of the signal to be amplified.

In some aspects, the envelope tracking power supply receives the information about the transmit waveform statistics from a modem (e.g., one or more of a RX Data Processor 270, a TX Data Processor 288, a DAC 308 and an ADC 328 or one or more of RX Data Processor 242, a TX Data Processor 210, a DAC 308 and an ADC 328) of the device transmitting a signal. For example, in some aspects, the modem may directly write to registers in the envelope tracking power supply that define the operating parameters of the envelope tracking power supply. In some aspects, the envelope tracking power supply may include a controller (e.g., microcontroller) that receives the information from the modem and adjusts the operating parameters of the envelope tracking power supply. For example, the controller may be coupled to components of the envelope tracking power supply (e.g., amplifier 454, switch mode power supply 452, filters, etc.). The controller may send signals, data, or adjust registers corresponding to the various components of the envelope tracking power supply. In some aspects, the information sent to the controller may include the actual information about the transmit waveform statistics, information about an amount of change in the transmit waveform statistics (e.g., amount the frequency and/or bandwidth have changed), or information indicating what action the controller should take. In some aspects, the modem has and communicates the information to the envelope tracking power supply using a mobile industry processor interface (MIPI) RF front-end (RFFE) bus. Whenever the transmit waveform statistics of the signal to be amplified changes (e.g., a RB allocation changes, a technology used for communication changes, etc.), the modem may send updated information to the envelope tracking power supply. In some aspects, the modem or controller determines or selects which parameter(s) of the envelope tracking power supply to adjust and how to adjust the parameter(s) based on the transmit waveform statistics (e.g., based on a value and/or type of transmit waveform statistic). While not illustrated in FIG. 4A, those of skill in the art will understand that a controller such as the controller described above may be implemented in the envelope tracking power supply 410 and may be coupled to one or both of the switch mode power supply 452 and the amplifier 454. The controller may further be coupled to a memory or registers (not illustrated) in the envelope tracking power supply 410 or to a memory or registers implemented external to the envelope tracking power supply 410.

Envelope tracking power supplies may further have tradeoffs between power conversion efficiency and RxBN, such as in FDD LTE operation. For example, where the envelope tracking power supply includes a switch mode power supply (SMPS), the SMPS may improve efficiency of the envelope tracking power supply, but also add noise to the output of the envelope tracking power supply. This noise may be coupled to a receiver of a device including the envelope tracking power supply, thereby generating RxBN.

In some aspects, envelope tracking power supplies may be configured based on the worst-case receive signal strength for a signal received by a receiver of a device. For example, there may be a lowest signal strength that a signal can be properly received. An envelope tracking power supply may therefore be configured to keep RxBN low in order to enable acceptable receive signal sensitivity for low signal strength signals at the expense of power conversion efficiency. Therefore, if a low signal strength signal is received at a device, the envelope tracking power supply has a low RxBN and the signal can be decoded. However, when the signal strength of the received signal is high, the RxBN is lower than needed and power conversion efficiency may not be maximized. In particular, a higher strength signal may still be able to be properly received and decoded even if the RxBN is higher, as the RxBN is a smaller fraction of the overall signal strength of the signal.

Accordingly, some aspects herein provide for configuring an envelope tracking power supply (e.g., envelope tracking power supply 410) based on the actual signal strength of a received signal at a device including the envelope tracking power supply. In particular, when the signal strength of the received signal is low, the envelope tracking power supply may be configured to have a lower RxBN to enable the signal to be properly received and decoded, even at the expense of power conversion efficiency for amplifying a signal to be transmitted. However, when the signal strength of the received signal is high, the envelope tracking power supply may be configured to have a higher RxBN, thereby improving power conversion efficiency for amplifying a signal to be transmitted, while still allowing a signal to be properly received and decoded by a receiver of the device. In some aspects, one or more parameters of the envelope tracking power supply, such as, a switching frequency of a switching regulator (e.g., switch mode power supply 452) of the envelope tracker, a bias current of an amplifier (e.g., amplifier 454) of the envelope tracker, a bandwidth of the amplifier, a compensation of the amplifier, etc. may be changed based on the received signal strength of signals received at a device including the envelope tracking power supply.

In some aspects, the envelope tracking power supply receives the information about the signal strength of a signal from a modem (e.g., one or more of a RX Data Processor 270, a TX Data Processor 288, a DAC 308 and an ADC 328 or one or more of RX Data Processor 242, a TX Data Processor 210, a DAC 308 and an ADC 328) of the device receiving the signal. For example, in some aspects, the modem may directly write to registers in the envelope tracking power supply that define the operating parameters of the envelope tracking power supply. In some aspects, the envelope tracking power supply may include a controller (e.g., microcontroller) that receives the information from the modem and adjusts the operating parameters of the envelope tracking power supply. For example, the controller may be coupled to components of the envelope tracking power supply (e.g., amplifier 454, switch mode power supply 452, filters, etc.). The controller may send signals, data, or adjust registers corresponding to the various components of the envelope tracking power supply. In some aspects, the information sent to the controller may include the actual signal strength of the signal, information about an amount the signal strength has changed, or information indicating what action the controller should take. In some aspects, the modem has and communicates the information to the envelope tracking power supply using a mobile industry processor interface (MIPI) RF front-end (RFFE) bus. Whenever the signal strength of received signals changes, the modem may send updated information to the envelope tracking power supply. In some aspects, the modem or controller determines or selects which parameter(s) of the envelope tracking power supply to adjust and how to adjust the parameter(s) based on the received signal strength. As described above, the controller, a memory, and/or registers may be implemented in the envelope tracking power supply 410.

The tradeoffs between power conversion efficiency and RxBN for an envelope tracking power supply may not only be made due to the signal strength of received signals at a device, but may be due to avoiding de-sensitizing a receiver of the device. As discussed above, in FDD LTE operation, a different frequency range may be used by receivers to receive signals than the frequency range used by transmitters to transmit signals. The overall system receive frequency range may be a large range utilized by multiple devices or signals.

In some aspects, an envelope tracking power supply may be configured to reduce or minimize RxBN across the entire overall system receive frequency range utilized by multiple devices or signals. Accordingly, the envelope tracking power supply may not have efficient power conversion, as RxBN is minimized for a device even on frequencies where the device is not actually receiving any signals.

Accordingly, some aspects herein provide for configuring an envelope tracking power supply (e.g., envelope tracking power supply 410) based on the actual frequency and/or bandwidth that signals are received by a device including the envelope tracking power supply, or based on an allocation for receiving signals of a subset (e.g., one or more RBs) of an overall system frequency and bandwidth for receiving signals. In particular, the envelope tracking power supply may be configured to minimize RxBN only at the actual frequency and/or bandwidth that signals are received by a device including the envelope tracking power supply, or based on an allocation for receiving signals of a subset (e.g., one or more RBs) of an overall system frequency and bandwidth for receiving signals. The envelope tracking power supply may therefore have improved power conversion efficiency by avoiding minimizing RxBN at frequencies not used by the device to receive signals. In some aspects, the envelope tracking power supply may adjust the frequencies where RxBN is minimized by adjusting a filter (e.g., notch filter) to reduce noise in the envelope tracking power supply. In certain aspects, adjusting a filter refers to adjusting an actual filter (e.g., notch filter) included in the envelope tracking power supply. For example, a filter (not illustrated in FIGS. 4 and 4A) maybe coupled to the path supplying the voltage 420 (e.g., between the envelope tracking power supply 410 and the PA 316), or in the envelope tracking power supply 410 after either the switch mode power supply 452 or the amplifier 454 or after the summer. In certain aspects, adjusting a filter refers to adjusting the sampling of switching edges of a switching regulator included in the envelope tracking power supply.

In some aspects, the envelope tracking power supply receives the information about the allocated subset or actual frequency and/or bandwidth from a modem (e.g., one or more of a RX Data Processor 270, a TX Data Processor 288, a DAC 308 and an ADC 328 or one or more of RX Data Processor 242, a TX Data Processor 210, a DAC 308 and an ADC 328) of the device receiving a signal. For example, the modem may have and send information regarding the location of a receiver of the device (e.g., a bandwidth and offset frequency used by the receiver relative to a transmitter of the device that utilizes the envelope tracking power supply) to the envelope tracking power supply. The envelope tracking power supply may utilize this information to minimize noise at the actual receive frequency and/or bandwidth utilized by the receiver. For example, in some aspects, the modem may directly write to registers in the envelope tracking power supply that define the operating parameters of the envelope tracking power supply. In some aspects, the envelope tracking power supply may include a controller (e.g., microcontroller) that receives the information from the modem and adjusts the operating parameters of the envelope tracking power supply. For example, the controller may be coupled to components of the envelope tracking power supply (e.g., amplifier 454, switch mode power supply 452, filters, etc.). The controller may send signals, data, or adjust registers corresponding to the various components of the envelope tracking power supply. In some aspects, the information sent to the controller may include the actual information about the allocated subset or actual frequency and/or bandwidth, information about an amount the frequency and/or bandwidth have changed, or information indicating what action the controller should take. In some aspects, the modem has and communicates the information to the envelope tracking power supply using a mobile industry processor interface (MIPI) RF front-end (RFFE) bus. Whenever the frequency and bandwidth of the signals received changes (e.g., a RB allocation changes, a technology used for communication changes, etc.), the modem may send updated information to the envelope tracking power supply. In some aspects, the modem or controller determines or selects which parameter(s) of the envelope tracking power supply to adjust and how to adjust the parameter(s) based on the frequency, bandwidth, and/or RB allocation for receiving a signal. As described above, the controller, a memory, and/or registers may be implemented in the envelope tracking power supply 410.

Figure 5:
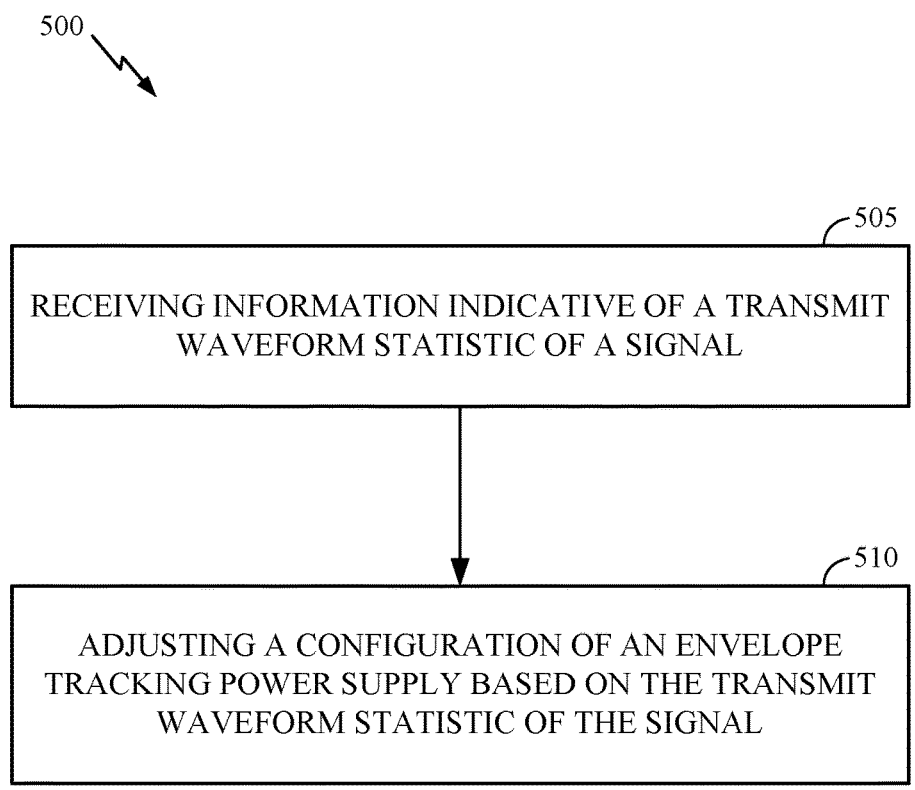
FIG. 5 illustrates example operations for an envelope tracking power supply, in accordance with certain aspects of the present disclosure.

FIG. 5 illustrates example operations 500 for an envelope tracking power supply, in accordance with certain aspects of the present disclosure.

At 505, the envelope tracking power supply receives information indicative of a transmit waveform statistic of a signal to be transmitted by a device including the envelope tracking power supply. For example, the device may include a modem, a receiver, and a transmitter. The envelope tracking power supply may supply power to an amplifier used by the transmitter to amplify signals for transmission. In some aspects, the modem may determine the transmit waveform statistics actually used for signals to be amplified by the amplifier supplied by the envelope tracking power supply and send information indicative of this to the envelope tracking power supply.

At 510, a configuration of the envelope tracking power supply is adjusted based on the transmit waveform statistics of the signal. In some aspects, one or more parameters of the envelope tracking power supply may be adjusted, the one or more parameters comprising one or more of a switching frequency of a switching regulator of the envelope tracking power supply, a bias current of an amplifier of the envelope tracking power supply, a bandwidth of the amplifier, a compensation of the amplifier, and an internal voltage headroom of the envelope tracking power supply. In some aspects, noise reduction of the envelope tracking power supply is targeted at the frequency and bandwidth of the received signal. The configuration may be adjusted by the modem of the device setting registers of the envelope tracking power supply, or by a controller of the envelope tracking power supply.

Figure 6:
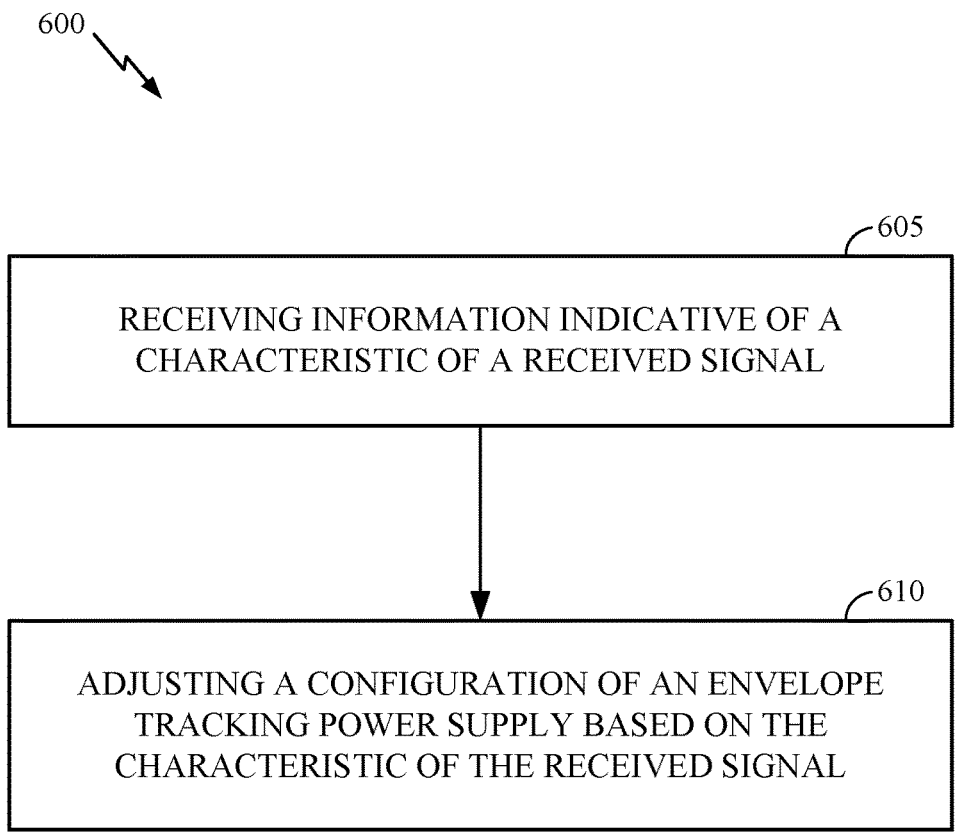
FIG. 6 illustrates example operations for an envelope tracking power supply, in accordance with certain aspects of the present disclosure.

FIG. 6 illustrates example operations 600 for an envelope tracking power supply, in accordance with certain aspects of the present disclosure.

At 605, the envelope tracking power supply receives information indicative of a characteristic of a signal to received by a device including the envelope tracking power supply. For example, the device may include a modem, a receiver, and a transmitter. The envelope tracking power supply may supply power to an amplifier used by the transmitter to amplify signals for transmission. In some aspects, the modem may determine the frequency and/or bandwidth actually used for or allocated for receiving signals by the receiver and send information indicative of this to the envelope tracking power supply. In some aspects, the modem may determine the signal strength of the received signal.

At 610, a configuration of the envelope tracking power supply is adjusted based on the determined characteristic of the received signal. In some aspects, one or more parameters of the envelope tracking power supply may be adjusted, the one or more parameters comprising one or more of a switching frequency of a switching regulator of the envelope tracking power supply, a bias current of an amplifier of the envelope tracking power supply, a bandwidth of the amplifier, a compensation of the amplifier, and an internal voltage headroom of the envelope tracking power supply. In some aspects, noise reduction of the envelope tracking power supply is targeted at the frequency and bandwidth of the received signal. The configuration may be adjusted by the modem of the device setting registers of the envelope tracking power supply, or by a controller of the envelope tracking power supply.

While described separately above, an envelope tracking power supply may receive information indicative of both a transmit waveform statistic and a characteristic of a signal to received. For example, a controller implemented in the envelope tracking supply may be configured to perform all of 505, 510, 605, and 610 described in FIGS. 5 and 6 above. In some embodiments the controller may be configured to independently receive and act upon all such information. In some embodiments, the controller may be configured to receive all information and then determine appropriate settings and/or adjustments to the envelope tracking power supply based on the aggregated information. In some embodiments, the controller is configured with a prioritization engine and/or a conflict resolution system to determine appropriate settings or adjustments when transmit and receive information might otherwise dictate conflicting settings or adjustments. In some embodiments, the modem resolves such potential conflicts prior to sending adjustments or information to the envelope tracking power supply.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for operating an envelope tracking power supply, the method comprising:
   receiving, from a modem of a device, information indicative of a transmit waveform statistic of a signal to be wirelessly transmitted by the device, the transmit waveform statistic comprising a resource block allocation for transmitting the signal; and
   adjusting a configuration of the envelope tracking power supply based on the transmit waveform statistic of the signal.

2. The method of claim 1, wherein the transmit waveform statistic further comprises at least one of a frequency of the signal, a bandwidth of the signal, a modulation scheme for modulating the signal, and a peak to average ratio of the signal.

3. The method of claim 1, wherein adjusting the configuration comprises adjusting at least one parameter of a plurality of parameters of the envelope tracking power supply, and further comprising selecting the at least one parameter from the plurality of parameters based on the information indicative of the transmit waveform statistic.

4. The method of claim 1, wherein adjusting the configuration comprises adjusting one or more parameters of the envelope tracking power supply, the one or more parameters comprising a compensation of an amplifier of then envelope tracking power supply.

5. The method of claim 1, wherein adjusting a configuration of the envelope tracking power supply comprises changing a register associated with the envelope tracking power supply.

6. A method for operating an envelope tracking power supply, the method comprising:
   receiving, from a modem of a device, information indicative of at least one of a frequency, a bandwidth, or a resource block allocation for wirelessly receiving a signal; and
   adjusting a configuration of the envelope tracking power supply based on the at least one of the frequency, the bandwidth, or the resource block allocation for receiving the signal, wherein adjusting the configuration of the envelope tracking power supply comprises adjusting a sampling of switching edges of a switching regulator of the envelope tracking power supply.

7. The method of claim 6, wherein adjusting the configuration of the envelope tracking power supply comprises targeting noise reduction of the envelope tracking power supply at the at least one of the frequency, the bandwidth, or the resource block allocation for receiving the signal.

8. The method of claim 7, wherein targeting noise reduction comprises adjusting a notch filter of the envelope tracking power supply.

9. An envelope tracking power supply comprising:
   a voltage regulator, and
   a controller configured to:
      receive, from a modem of a device, information indicative of a transmit waveform statistic of a signal to be wirelessly transmitted by the device, the transmit waveform statistic comprising a resource block allocation for transmitting the signal; and
      adjust a configuration of the envelope tracking power supply based on the transmit waveform statistic of the signal.

10. The envelope tracking power supply of claim 9, wherein the transmit waveform statistic further comprises at least one of a frequency of the signal, a bandwidth of the signal, a modulation scheme for modulating the signal, and a peak to average ratio of the signal.

11. The envelope tracking power supply of claim 9, wherein to adjust the configuration comprises to adjust at least one parameter of a plurality of parameters of the envelope tracking power supply, and wherein the controller is further configured to select the at least one parameter from the plurality of parameters based on the information indicative of the transmit waveform statistic.

12. The envelope tracking power supply of claim 9, wherein to adjust the configuration comprises to adjust one or more parameters of the envelope tracking power supply, the one or more parameters comprising amplifier of the envelope tracking power supply.

13. The envelope tracking power supply of claim 9, wherein to adjust a configuration of the envelope tracking power supply comprises to change a register associated with the envelope tracking power supply.

14. An envelope tracking power supply comprising:
   a voltage regulator, and
   a controller configured to:
      receive, from a modem of a device, information indicative of at least one of a frequency, a bandwidth, or a resource block allocation for wirelessly receiving a signal; and
      adjust a configuration of the envelope tracking power supply based on the at least one of the frequency, the bandwidth, or the resource block allocation for receiving the signal, wherein to adjust the configuration of the envelope tracking power supply comprises to adjust a sampling of switching edges of a switching regulator of the envelope tracking power supply.

15. The envelope tracking power supply of claim 14, wherein to adjust the configuration of the envelope tracking power supply comprises to target noise reduction of the envelope tracking power supply at the at least one of the frequency, the bandwidth, or the resource block allocation for receiving the signal.

16. The envelope tracking power supply of claim 15, wherein to target noise reduction comprises to adjust a notch filter of the envelope tracking power supply.

* * * * *